United States Patent
Fischels et al.

(10) Patent No.: US 12,235,718 B2
(45) Date of Patent: Feb. 25, 2025

(54) CIRCUIT INTERRUPT DEVICE FAULT DURATION MONITOR

(71) Applicant: Schneider Electric USA, Inc., Andover, MA (US)

(72) Inventors: Collin Richard Fischels, Independence, IA (US); Juan Ignacio Melecio Ramirez, North Liberty, IA (US); Adrian Abdala Rendon Hernandez, Tiffin, IA (US); Kenneth Riehl, Solon, IA (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 18/227,232

(22) Filed: Jul. 27, 2023

(65) Prior Publication Data

US 2025/0036505 A1 Jan. 30, 2025

(51) Int. Cl.
*G06F 11/07* (2006.01)
*G06F 11/32* (2006.01)

(52) U.S. Cl.
CPC ........ *G06F 11/0772* (2013.01); *G06F 11/076* (2013.01); *G06F 11/322* (2013.01)

(58) Field of Classification Search
CPC ... G06F 11/0772; G06F 11/076; G06F 11/322
See application file for complete search history.

(56) References Cited

U.S. PATENT DOCUMENTS

| | | | |
|---|---|---|---|
| 7,110,864 B2 * | 9/2006 | Restrepo | H02H 1/0015 324/536 |
| 9,759,758 B2 * | 9/2017 | Ostrovsky | G01R 31/50 |

(Continued)

FOREIGN PATENT DOCUMENTS

EP   3827453 B1   4/2023

OTHER PUBLICATIONS

T. Wang and A. Monti, "Fault Detection and Isolation in DC Microgrids Based on Singularity Detection in the Second Derivative of Local Current Measurement," IEEE Journal of Emerging and Selected Topics in Power Electronics, vol. 9, No. 3, pp. 2574-2588, Jun. 2021 (Year: 2021).*

(Continued)

*Primary Examiner* — Matthew M Kim
*Assistant Examiner* — Indranil Chowdhury
(74) *Attorney, Agent, or Firm* — Troutman Pepper Locke LLP

(57) ABSTRACT

Methods/systems for monitoring fault duration in circuit interrupt devices perform edge detection using a second time derivative of a current or voltage waveform. The second derivative reveals peaks that may be used to establish starting and ending times for the fault duration. In some embodiments, the second derivatives are derived only for portions of the waveform within time windows that enclose the fault duration starting and ending times, respectively. The above arrangement provides a consistent way of determining durations of transitory events, such as durations of faults, and the like, that does not rely on waveform zero-crossings. The duration determinations may be implemented locally within a device, and/or the device may acquire and transfer underlying waveform data to an external system for the duration determinations. Data from multiple devices may be collected over time for analysis and modeling to provide remote support and monitoring of local devices via digital twins.

20 Claims, 7 Drawing Sheets

(56) References Cited

U.S. PATENT DOCUMENTS

| | | | | |
|---|---|---|---|---|
| 10,848,198 | B1* | 11/2020 | Jakupi | H02H 3/167 |
| 2012/0300348 | A1* | 11/2012 | Franks | H02H 7/263 |
| | | | | 361/42 |
| 2013/0077204 | A1 | 3/2013 | Berggren et al. | |
| 2015/0097594 | A1* | 4/2015 | Graber | G01R 31/40 |
| | | | | 324/764.01 |
| 2017/0141559 | A1 | 5/2017 | Blumschein et al. | |
| 2018/0217205 | A1* | 8/2018 | Bruhn, Jr. | G01R 31/42 |
| 2021/0165024 | A1* | 6/2021 | Menzel | H02J 3/0012 |
| 2021/0231736 | A1* | 7/2021 | Achanta | G01R 31/3333 |
| 2022/0021195 | A1* | 1/2022 | Rathi | H02H 3/167 |
| 2022/0196710 | A1* | 6/2022 | Bickel | G01R 31/08 |
| 2024/0071704 | A1* | 2/2024 | Rodrigues | H01H 71/123 |
| 2024/0178653 | A1* | 5/2024 | Telefus | H02H 3/32 |

OTHER PUBLICATIONS

S. Salas and E. Hille, "Calculus: One and Several Variables," 1982, pp. 149-161, 4th Edition (Year: 1982).*

Extended European Search Report dated Jan. 3, 2025 for App. No. 24186651.6, 11 pages.

* cited by examiner

CIRCUIT INTERRUPT DEVICE FAULT DURATION MONITOR

TECHNICAL FIELD

The present disclosure relates to electronic circuit breakers, wiring devices, and other protective devices that can interrupt current flowing through the devices, and more particularly to methods and systems for determining and monitoring the duration of transitory events, such as the duration of faults, and the like, in such monitoring and protective devices.

BACKGROUND

Modern protective devices, such as circuit breakers, wiring devices, and other devices that can interrupt current flow to a load, have components that enable several functions not previously available in prior devices. For example, a CPU (e.g., microcontroller) in an electronic circuit breaker allows the breaker to function as both a ground fault circuit interrupt (GFCI) device as well as an arc fault circuit interrupt (AFCI) device. The CPU detects such faults by constantly sensing and sampling line current and monitoring these samples for indications of a fault condition. Upon detection of a fault condition, the CPU outputs a trip signal to a trip unit that trips or otherwise interrupts current flow in the breaker.

In circuit interrupt devices, the time it takes for a device to trip can provide an important indicator of whether the device is operating properly or if the device needs to be replaced. Tripping analysis typically involves measurement of quantities that characterize the protective device, such as fault duration, current RMS, and peak values, and the presence of transients. For fault duration, industry standards suggest using current waveform zero-crossings as starting and/or ending points to measure the fault duration. However, fault events can often start and end at non-zero-crossings, and moreover the current waveform may contain large perturbations caused by the closing and opening of the trip unit contacts. The use of zero-crossings therefore presents challenges to accurately determine fault durations.

Accordingly, a need exists for a way to determine the duration of transitory events, such as the duration of faults, in circuit interrupt devices that do not require the use of current or voltage waveform zero-crossings.

SUMMARY

Embodiments of the present disclosure provide systems and methods for determining and monitoring the duration of transitory events, such as the duration of faults, in circuit breakers, wiring devices, and other devices that can interrupt current flow to a load. The systems and methods use a time derivative of a current or voltage waveform to determine fault duration in such circuit interrupt devices. In some embodiments, the systems and methods use a second derivative of the current or voltage waveform to determine the starting and ending times for the fault duration. In some embodiments, the systems and methods derive the second derivatives only for portions of the current or voltage waveform within a starting time window and an ending time window that approximate the starting and ending times, respectively, for the fault duration. Techniques for deriving a second derivative of a waveform are known in the art and may be implemented using any suitable programming language. The second derivatives test reveals peaks, such as local maxima and local minima, within the starting and ending time windows that may be set or declared as the starting and ending times for the fault duration.

The above arrangement provides a uniform and consistent way of determining fault duration that is more accurate compared to techniques that rely on waveform zero-crossings. The fault duration determination above may be implemented locally within a circuit interrupt device to provide local monitoring of fault duration for the device, or the circuit interrupt device may acquire and transfer underlying waveform data and/or local fault duration determinations to an external system, such as a cloud computing environment, for analysis and modeling of the fault durations. In the latter case, waveform data and/or local fault duration determinations from multiple devices collected over time under different operating conditions may be transferred to the external system and analyzed and modeled. Such analysis and modeling may then be used to provide remote support and monitoring of local circuit interrupt device fault durations via their digital twins. The analysis and modeling may also be used to further develop, optimize, and improve device trip units and related components.

In general, in one aspect, embodiments of the present disclosure relate to a circuit interrupt protective device. The device comprises, among other things, a central processing unit (CPU) and a sense circuit connected to the CPU. The sense circuit is configured to sense a current or a voltage waveform in the circuit interrupt protective device, the current or voltage waveform originating from an AC mains. The device also comprises an analog-to-digital converter (ADC) coupled to the CPU and configured to acquire the current or voltage waveform sensed by the sensor circuit, and a fault detection module coupled to the ADC and configured to receive the current or voltage waveform acquired by the ADC. The fault detection module is operable to detect a fault event based on the current or voltage waveform. The device further comprises a fault duration module coupled to the ADC and configured to receive the current or voltage waveform acquired by the ADC, the fault duration module operable to obtain a duration of the fault event based on the current or voltage waveform. In some embodiments, the duration of the fault event is obtained by computing a second derivative for a portion of the current or voltage waveform, finding a local maximum or a local minimum for the portion of the current or voltage waveform, and setting the local maximum or the local minimum as a starting time or an ending time for the duration of the fault event.

In general, in another aspect, embodiments of the present disclosure relate to a method of determining a duration of a fault event in a circuit interrupt protective device. The method comprises, among other things, sensing, at a sensor circuit of the circuit interrupt protective device, a current or a voltage waveform in the circuit interrupt protective device, the current or voltage waveform originating from an AC mains. The method additionally comprises acquiring, at an analog-to-digital converter (ADC) of the circuit interrupt protective device, the current or voltage waveform sensed by the sensor circuit. The method also comprises receiving, at a fault detection module of the circuit interrupt protective device, the current or voltage waveform acquired by the ADC, the fault detection module operable to detect a fault event based on the current or voltage waveform. The method further comprises receiving, at a fault duration module of the circuit interrupt protective device, the current or voltage waveform acquired by the ADC, the fault duration module operable to obtain a duration of the fault event based on the current or voltage waveform. In some embodiments, the duration of the fault event is obtained by computing a second derivative for a portion of the current or voltage waveform, finding a local maximum or a local minimum for the portion of the current or voltage waveform, and setting the local maximum or the local minimum as a starting time or an ending time for the duration of the fault event.

In general, in still another aspect, embodiments of the present disclosure relate to a non-transitory computer-readable medium having computer-readable instructions stored thereon for determining a duration of a fault event in a circuit interrupt protective device. The computer-readable instructions, when executed by a processor, cause the processor to perform a process that senses, at a sensor circuit of the circuit interrupt protective device, a current or a voltage waveform in the circuit interrupt protective device, the current or voltage waveform originating from an AC mains. The computer-readable instructions additionally cause the processor to perform a process that acquires, at an analog-to-digital converter (ADC) of the circuit interrupt protective device, the current or voltage waveform sensed by the sensor circuit. The computer-readable instructions also cause the processor to perform a process that receives, at a fault detection module of the circuit interrupt protective device, the current or voltage waveform acquired by the ADC, the fault detection module operable to detect a fault event based on the current or voltage waveform. The computer-readable instructions further cause the processor to perform a process that receives, at a fault duration module of the circuit interrupt protective device, the current or voltage waveform acquired by the ADC, the fault duration module operable to obtain a duration of the fault event based on the current or voltage waveform. In some embodiments, the duration of the fault event is obtained by computing a second derivative for a portion of the current or voltage waveform, finding a local maximum or a local minimum for the portion of the current or voltage waveform, and setting the local maximum or the local minimum as a starting time or an ending time for the duration of the fault event.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Further, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
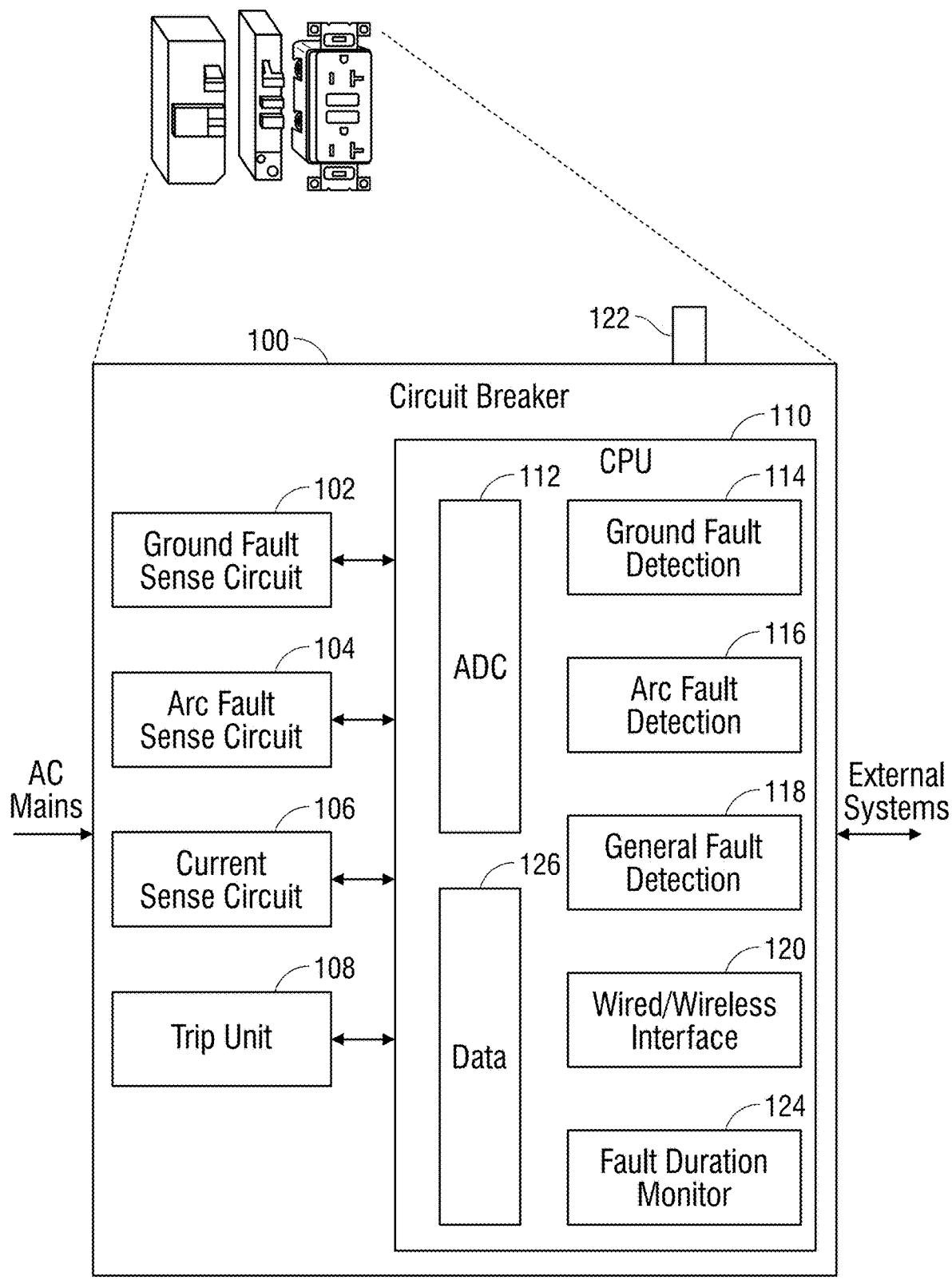
FIG. 1 illustrates an exemplary circuit breaker protective device that can perform fault duration determination according to embodiments of the present disclosure.

Referring now to FIG. 1, an exemplary electronic circuit breaker 100 is shown according to one or more embodiments of the present disclosure. The breaker 100 in this example is a dual function AFCI/GFCI miniature circuit breaker, although embodiments of the present disclosure apply equally to other types of circuit breakers and circuit interrupt protective devices. The breaker 100 shown here has a number of functional components or modules, represented in block diagram form, that allow the breaker 100 to perform arc fault detection, ground fault detection, and other functions. It will be understood that each block shown here (and in subsequent figures) may be divided into several constituent blocks, or several blocks may be combined into a single block, within the scope of the present disclosure. Similarly, it will be understood that each block may be implemented via software (e.g., programming), hardware (e.g., ASIC), or a combination of both, within the scope of the present disclosure.

As can be seen, the breaker 100 includes a ground fault sense circuit 102, an arc fault sense signal 104, a current sense circuit 106, and a trip unit 108, in communication with a CPU 110. The CPU 110, which may be a microcontroller or other type of controller, includes at least one analog-to-digital converter (ADC) 112, a ground fault detection module 114, an arc fault detection module 116, a general fault detection module 118 that can detect short-circuits and overload currents and the like, and a wire and/or wireless interface module 120. It is also possible for the ADC 112 to be a separate component from the CPU 110 in some embodiments and, in either case, should have sufficient resolution (e.g., 8-bit, 12-bit, 16-bit, etc.) and sampling speed (e.g., 50,000 samples/second) for the purposes herein. Other functional components and modules not expressly shown, such as a signal filtering and conditioning circuit, may also be included within the scope of the present disclosure. Likewise, one or more of the expressly shown functional components and modules may be removed without departing from the disclosure.

Operation of the breaker 100 is generally well known in the art and therefore only a brief description is provided herein. In general, the CPU 110 receives analog signals from the ground fault sense circuit 102, arc fault sense circuit 104, current sense circuit 106, and other circuits that can sense AC mains current and voltage. These analog signals, which may include current signals and voltage signals, are sampled by the ADC 112 at a certain sampling rate that is sufficiently high for load recognition and disaggregation and waveform amplitude detection. The ADC 112 converts each sample into a numerical value that is proportional to an amplitude of the sample and outputs these values as a time data sequence. The data sequence is then processed in a known manner by the CPU 110 to detect occurrence of ground faults, arc faults, short-circuits, and so forth. Upon detecting a fault condition, the CPU 110 issues a trip signal to the trip unit 108 that causes the trip unit to immediately interrupt current flow through the breaker 100. A set/reset latch 122 allows a user to manually set/reset the breaker 100 after a tripping event.

In accordance with one or more embodiments, a fault duration monitor 124 may be provided in the CPU 110 for detecting and monitoring fault durations in the breaker 100. A fault duration refers to the duration of a fault event, such as a ground fault event, an arc fault event, a short-circuit event, an overload current event, and other current and voltage based transitory events that may be detected by a protective device like the breaker 100. The duration of the fault event reflects the time required for the protective device to clear the fault (i.e., interrupt the circuit), and generally includes detecting a fault current or voltage, deciding whether there if a fault event, issuing a trip signal to a trip unit to open a trip mechanism, and opening the contacts of the trip mechanism to clear the fault. In some embodiments, the duration of the fault event may be defined as $\Delta t = t_{end} - t_{start}$, where $t_{start}$ is the time the fault event starts and $t_{end}$ is the time the protective device trips. As mentioned earlier, fault events can often start and end at non-zero-crossings, and the current and/or voltage waveform can also contain large perturbations caused by the closing/opening of the trip unit contacts, all of which can make it difficult to accurately perform edge detection for determining a fault duration. The fault duration monitor 124 overcomes the uncertainty associated with using zero-crossings by performing edge detection based on a time derivative of the current and/or voltage waveform to determine fault durations.

More specifically, the fault duration monitor 124 performs edge detection using a second derivative (or f" (x)) of the current and/or voltage waveform to find a fault duration starting and ending times. This involves the fault duration monitor 124 acquiring samples of the current flowing through the breaker 100 via the current sense circuit 106 and the ADC 112. The samples may be obtained from either the current or voltage waveform, and preferably at a sampling rate of 50 kSamples/sec, although a lower or higher sampling rate may be used depending on the particular application. The samples are then stored in a data storage 126 of the breaker 100 for processing. In some embodiments, sampling is performed by the ADC 112 on a continuous basis, but only a predefined amount of data is stored at any given time in the breaker 100, such as one second of samples, on a first-in-first-out basis. This helps reduce the amount of data that needs to be stored and processed in the breaker 100, thus easing the processing burden on the breaker 100. Then, when a fault event occurs and the breaker 100 is tripped, the fault duration monitor 124 uses the sample/data stored at the time of the trip to determine the fault duration.

In some embodiments, determining the fault duration begins with the fault duration monitor 124 running the acquired data through a filter, such as a Butterworth low-pass filter, to remove abnormalities and noise. Other types of data filtering and signal conditioning techniques known in the art may also be used.

Next, the fault duration monitor 124 performs a basic threshold check to define a starting time window and an ending time window in which to perform the second derivative-based edge detection, which further reduces the amount of data processing needed. The starting and ending time windows approximate (enclose) the starting and ending times, respectively, for the fault duration, such that only the portions of the waveform within these windows are processed to determine the starting and ending times. In some embodiments, the basic threshold check may involve the fault duration monitor 124 searching forward from the beginning of the acquired data set and backward from the end of the data set until a current or voltage transient is found near each end of the data set that exceeds a nominal current or voltage amplitude (or magnitude) by a predefined threshold (e.g., 30%). In some embodiments, RMS values may be used instead of transient amplitudes.

These two data points, once found, are then used to establish the starting and ending time windows, respectively, by limiting the starting time window to a predefined subset of data samples (e.g., 100 samples, 0.002 sec, etc.) that contains the first (starting) data point, and the ending time window to a predefined subset of data samples (e.g., 100 samples, 0.002 sec, etc.) that contains the second (ending) data point, in some embodiments. The fault duration monitor 124 thereafter derives second derivatives only for the subset of data within the starting and ending time windows. As mentioned earlier, various techniques are known in the art for obtaining a second derivative of waveform samples using any suitable programming language. From the second derivatives, the fault duration monitor 124 selects the two points that have the greatest transient amplitudes (which may be a local maxima, or local minima) within the starting and ending time windows, respectively, and sets these points as the starting and ending times for the fault duration. Depending on the particular implementation, a local maximum may be used for both the starting and ending times, or a local minimum may be used for both the starting and ending times. Alternatively, a local maximum may be used for the starting time while a local minimum may be used for the ending time, or vice versa. As well, the above may change from one fault duration determination to another as needed. In general, the prominence of the local maximum or local minimum will determine which one is chosen for the fault duration determination.

In some embodiments, if the fault duration determined by the fault duration monitor 124 exceeds a predefined threshold and/or fails certain predefined criteria, then the fault duration monitor 124 may declare an error via the CPU 110. For example, if the fault duration determined by the fault duration monitor 124 exceeds a specified maximum, or if a certain number of consecutive fault durations determined by the fault duration monitor 124 exceeds another (or the same) specified maximum, then the fault duration monitor 124 may declare an error. Upon declaration of an error, the fault duration monitor 124 may send a predefined visual, audio, and/or textual alert to notify a user of the error, or otherwise provide an indication of the error on the breaker 110. The fault duration monitor 124 may also take one or more actions automatically at that point, via the CPU 110, such as disabling or locking out the breaker 100 (e.g., denial of service state) or preventing the breaker from being set/reset via the latch 122. The fault duration monitor 124 may further provide the error declaration as well as the underlying current or voltage waveform data and the determined fault durations to one or more external systems for analysis and modeling, as shown in FIG. 2.

Figure 2:
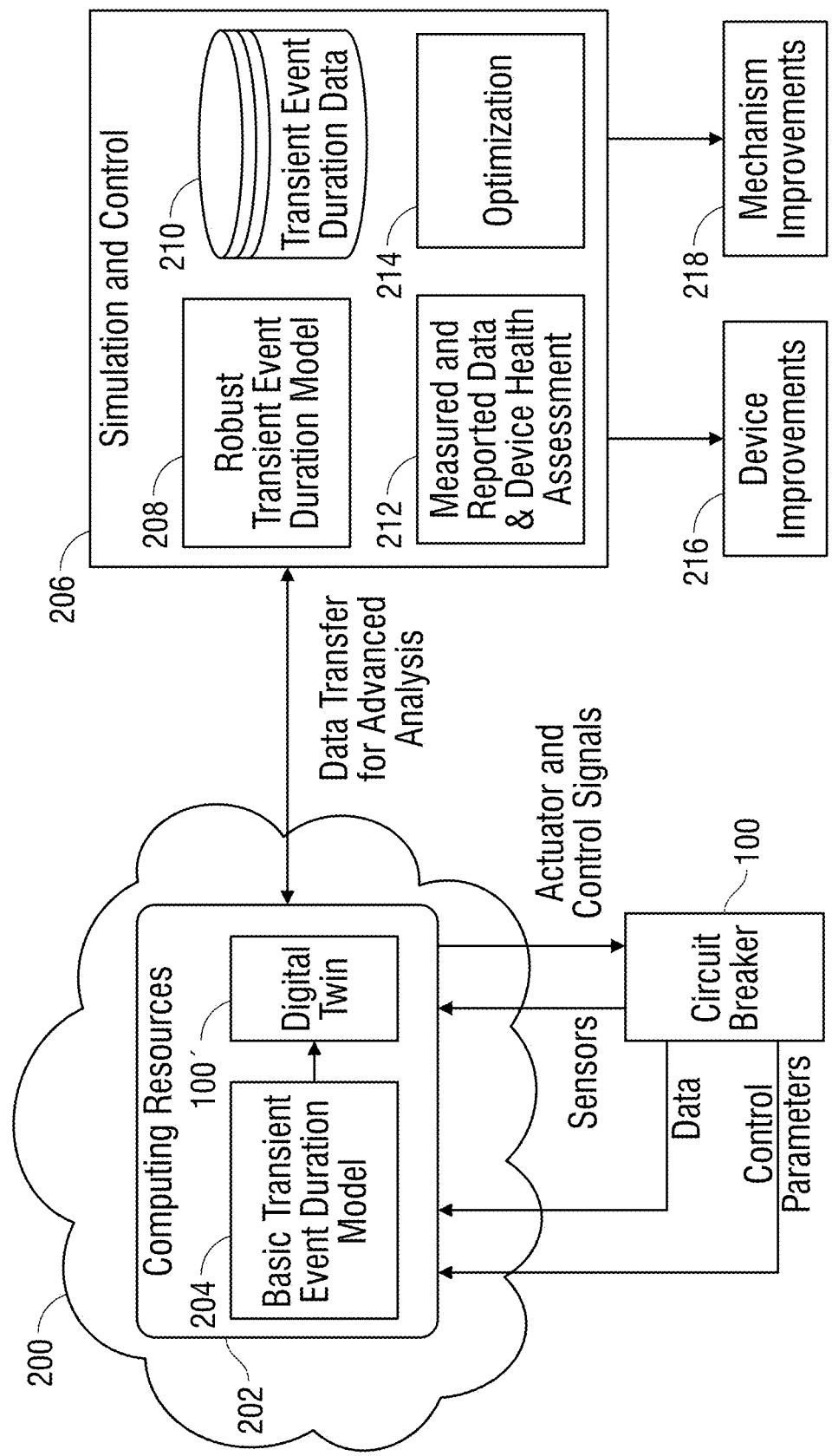
FIG. 2 illustrates exemplary external systems that can perform fault duration determination according to embodiments of the present disclosure.

FIG. 2 shows the breaker 100 connected to one or more external systems, including a cloud computing environment 200, for analysis and modeling of the fault durations. One or more cloud computing resources 202 may be provided on the cloud computing environment 200, such as database resources, processing resources, memory resources, network resources, and the like. In this example, the cloud computing resources 202 may be used to host a digital twin 100' of the breaker 100 that provides a virtual representation or simulation of the breaker 100. The digital twin 100' operates based on data from the sensors of the breaker 100, which may be provided to the digital twin 100' on a regular basis, either directly or indirectly, via the wired/wireless interface 120 of the breaker 100. Based on the sensor data, the digital twin 100' may issue actuator and control signals to the breaker 100 to control and operate the breaker. In some embodiments, the digital twin 100' may be used to perform the fault duration determination discussed herein instead of (or in addition to) the circuit breaker 100, using the processing resources 202 in the cloud computing environment 200. The digital twin 100' may then declare an error and send alert notifications if the fault duration exceeds a specified maximum, or if a certain number of consecutive fault durations exceeds another (or the same) specified maximum. The digital twin 100' may also update the breaker 100 (e.g., via a firmware update) with any operational adjustments or enhancements that may arise from the fault duration determinations.

In some embodiments, a transient event duration model 204 may be developed on the cloud computing environment 200 using the computing resources 202 in order to simulate the fault durations in the digital twin 100'. An initial or basic ("lite") version of the transient event duration model 204 may be developed based on the underlying waveform data and various control parameters for the circuit breaker 100. The data and control parameters may include, for example, fault duration, current and voltage ratings, rated interrupt current and voltage, and the like, as well as circuit breaker type, commission date, number of trips to date, and other information specific to the circuit breaker 100.

In some embodiments, the digital twin 100' may be accessed and used by a simulation and control system 206 for further analysis and modeling of the fault durations and other aspects of the circuit breaker 100. Such analysis and modeling may then be used to provide remote support and monitoring of the breaker 100 and other circuit interrupt protective devices locally via their digital twins. To this end, the simulation and control system 206 may be a private enterprise level simulation and control system that can be used to manage the overall lifecycle of the circuit breaker 100. Such a simulation and control system 206 may be used to perform more detailed or robust transient event duration modeling 208 based on waveform data and/or local fault duration determinations reported by multiple devices over time under different operating conditions. The reported waveform data and/or local fault duration data may be stored in a transient event duration data repository 210 along with measured data therefor. The simulation and control system 206 may also be used to compile measured and reported data to generate a device health assessment 212 for the breaker 100 and other circuit breakers and various circuit interrupt protective devices.

In some embodiments, the simulation and control system 206 may also be used to perform optimization 214 for the breaker 100 and other circuit interrupt protective devices. The optimization 214 may result in overall device improvements 216 that may be incorporated into the design and manufacture of circuit interrupt protective devices, as well as improvements in specific mechanisms (e.g., trip mechanism) used in these devices. Those having ordinary skill in the art will understand that the simulation and control system 206 and similar simulation and control systems can be used to realize numerous additional benefits and advantages during the lifecycle of the circuit interrupt protective devices without departing from the scope of the present disclosure.

Figure 3A:
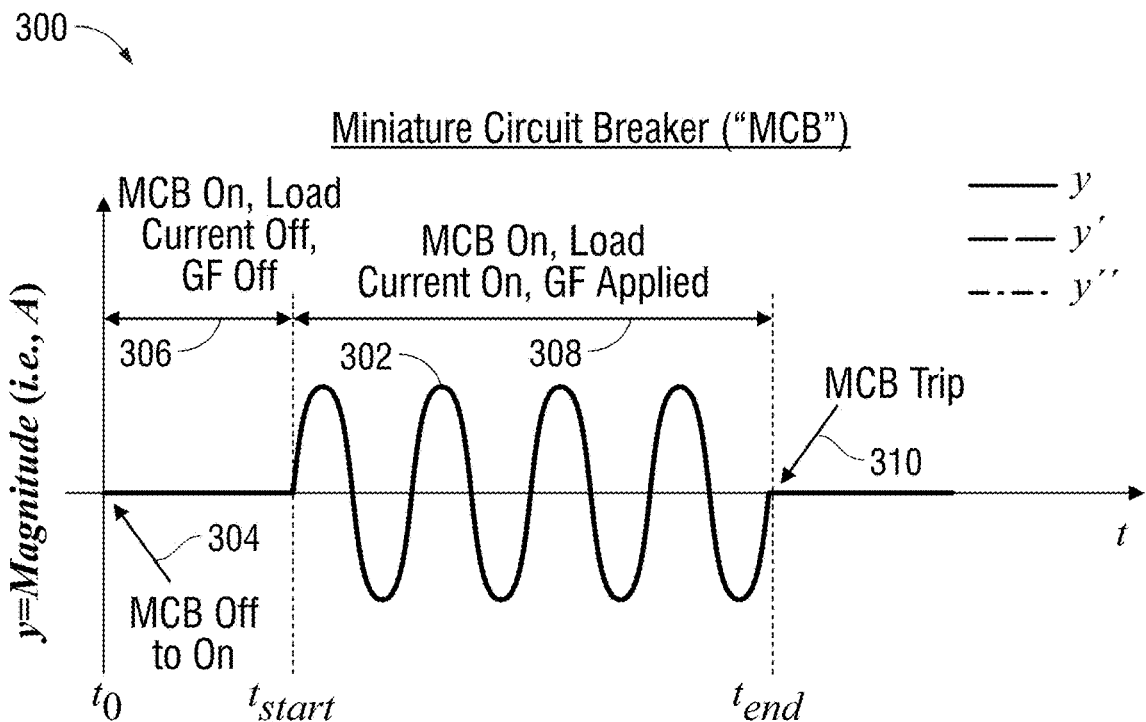
FIGS. 3A and 3B illustrate waveform graphs demonstrating exemplary fault duration determination according to embodiments of the present disclosure.
Figure 3B:
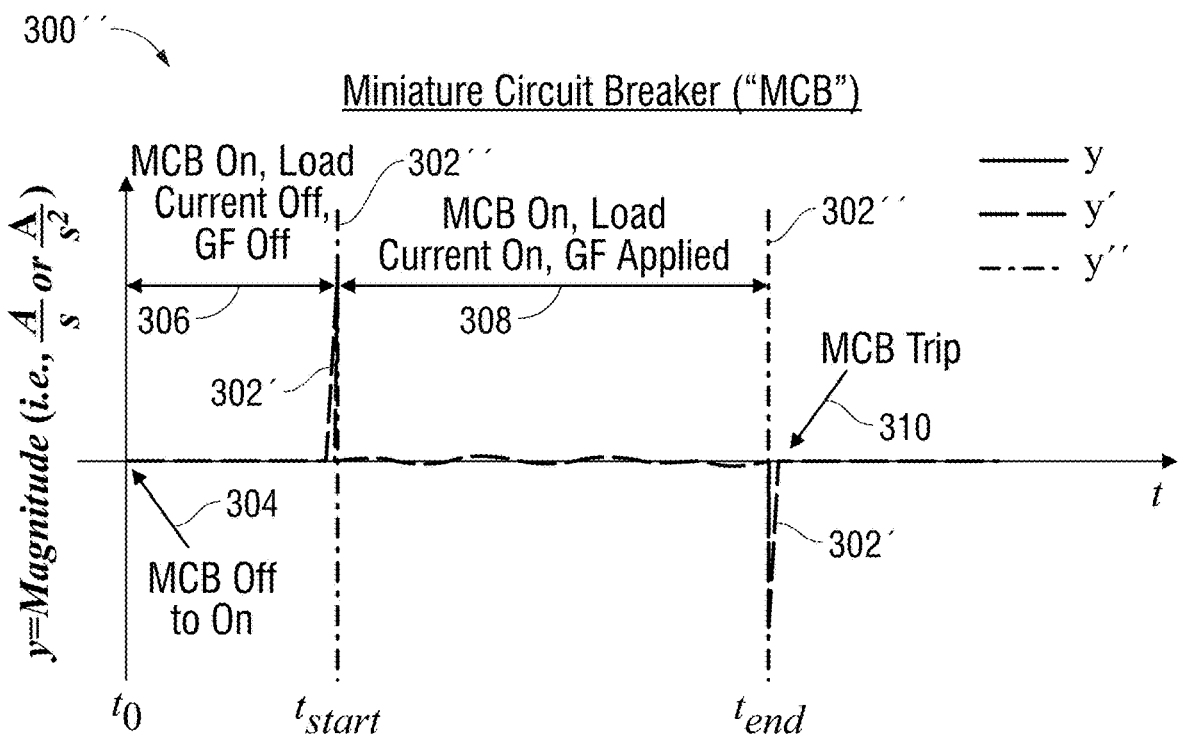

FIGS. 3A and 3B graphically illustrate how deriving a second derivative for a current or voltage waveform can be used to perform edge detection by or in a miniature circuit breaker (MCB) for the purposes herein. In particular, FIG. 3A depicts a graph 300 showing a test waveform 302 generated by a waveform generator to demonstrate the fault duration discussed herein, while FIG. 3B depicts another graph 300" representing a second derivative of the test waveform 302. In both graphs 300 and 300", the vertical axis represents current magnitude (Amps), and the horizontal axis represents time, while the test waveform 302 is a 60 Hz waveform that simulates a ground fault ("GF") current waveform.

Referring to FIG. 3A, the MCB is turned from an off state to and on state at 304 to begin the fault duration determination. An initial time interval 306 follows during which the MCB remains on, but the ground fault current waveform 302 is off, so there is no current flowing to the load. The ground fault current waveform 302 is thereafter applied to the MCB for a second time interval 308 to simulate occurrence of a ground fault event. The MCB detects the simulated ground fault event and automatically trips at 310 to interrupt the flow of current to the load.

A first derivative 302' is depicted in FIG. 3B along with a second derivative 302" for the ground fault current waveform 302. As can be seen, the second derivative 302" produces two sharp peaks (which may be either a local maxima or a local minima), one at the time the simulated ground fault current waveform 302 is applied to the MCB, and another at the time the MCB trips. These sharp peaks clearly stand out compared to the simulated ground fault current waveform 302 (FIG. 3A), and also compared to the first derivative 302' of the ground fault current waveform 302. The two peaks may then be set as the starting time ($t_{start}$) and the ending time ($t_{end}$) for the fault duration.

Figure 4:
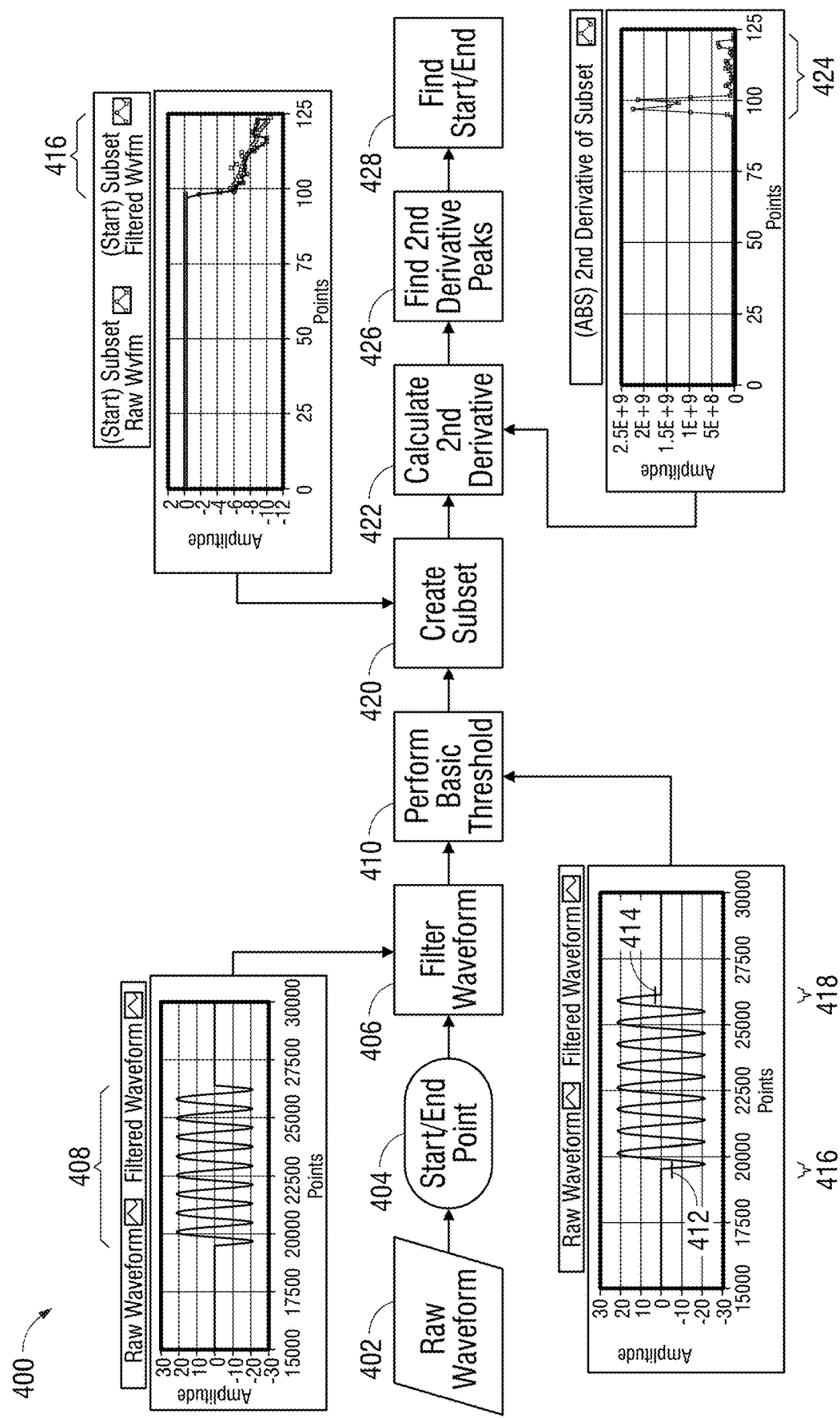
FIG. 4 illustrates a flow diagram for an exemplary method of performing fault duration determination according to embodiments of the present disclosure.

FIG. 4 is a flow diagram 400 representing a method that may be used by or with a circuit interrupt protective device like the breaker 100, and more specifically the fault duration monitor 124 therein, according to embodiments of the present disclosure. The method generally begins at 402 where a raw current or voltage waveform of the device is sampled, for example, at a rate of 50 kSamples/sec. At 404, a predefined amount of sample data is acquired and stored or otherwise saved in the device, for example, one second of data, on a first-in-first-out or rolling basis. This defines the initial start and end points of the waveform, resulting in a limited data set for processing purposes. At 406, a Butterworth low-pass filter or other filter and/or signal conditioning is applied to the waveform data to remove abnormalities and noise. The filtered and/or conditioned data set is graphically depicted seen at 408.

At 410, a basic threshold check is performed on the acquired data set to define a starting time window and an ending time window, thereby further reducing the amount of data processing needed. As discussed previously, the basic threshold check may involve searching forward from the beginning of the acquired data set and backward from the end of the data set to find a current (or voltage) transient near each end of the data set that has an amplitude (or magnitude) which exceeds a nominal current (or voltage) by a predefined threshold (e.g., 30%). The current (or voltage) transient near the beginning of the data set is indicated at 412, and the current (or voltage) transient near the end of the data set is indicated at 414. In some embodiments, RMS values may be used instead of transient amplitudes (or magnitudes).

At 420, the two data points 412 and 414 that were found are then used to establish a starting time window 416 and an ending time window 418, thereby creating a subset of the data to be processed. As discussed earlier, the starting and ending time windows 416 and 418 approximate the fault duration starting and ending times, respectively. As alluded to above, processing only data falling within these windows 416 and 418 allows the fault duration starting and ending times to be determined more quickly and efficiently, thereby reducing required computing capacity. In some embodiments, establishing the starting and ending time windows 416 and 418 involves limiting the starting time window 416 to a predefined subset of data points (e.g., 100 data points, 0.002 sec, etc.) that includes the starting data point 412, and limiting ending time window 418 to a predefined subset of data points (e.g., 100 data points, 0.002 sec, etc.) that includes the ending data point 414.

At 422, a second derivative is calculated for the data points within the starting and ending time windows 416 and 418 using techniques known in the art. The second derivative produces a local maximum or local minimum within each starting and ending time windows 416 and 418 that can be used as the starting and ending times, respectively, for the fault duration. The local maximum for the ending time window 418 can be seen at 424. At 426, a search is performed to find the local maximum or local minimum within the starting and ending time windows 416 and 418. The local maximum or local minimum are the peaks that clearly stand out compared to the remainder of the data in the starting and ending time windows 416 and 418. At 428, a local maximum or local minimum is set as the starting time ($t_{start}$) and the ending time ($t_{end}$), respectively, for the fault duration.

Figure 5A:
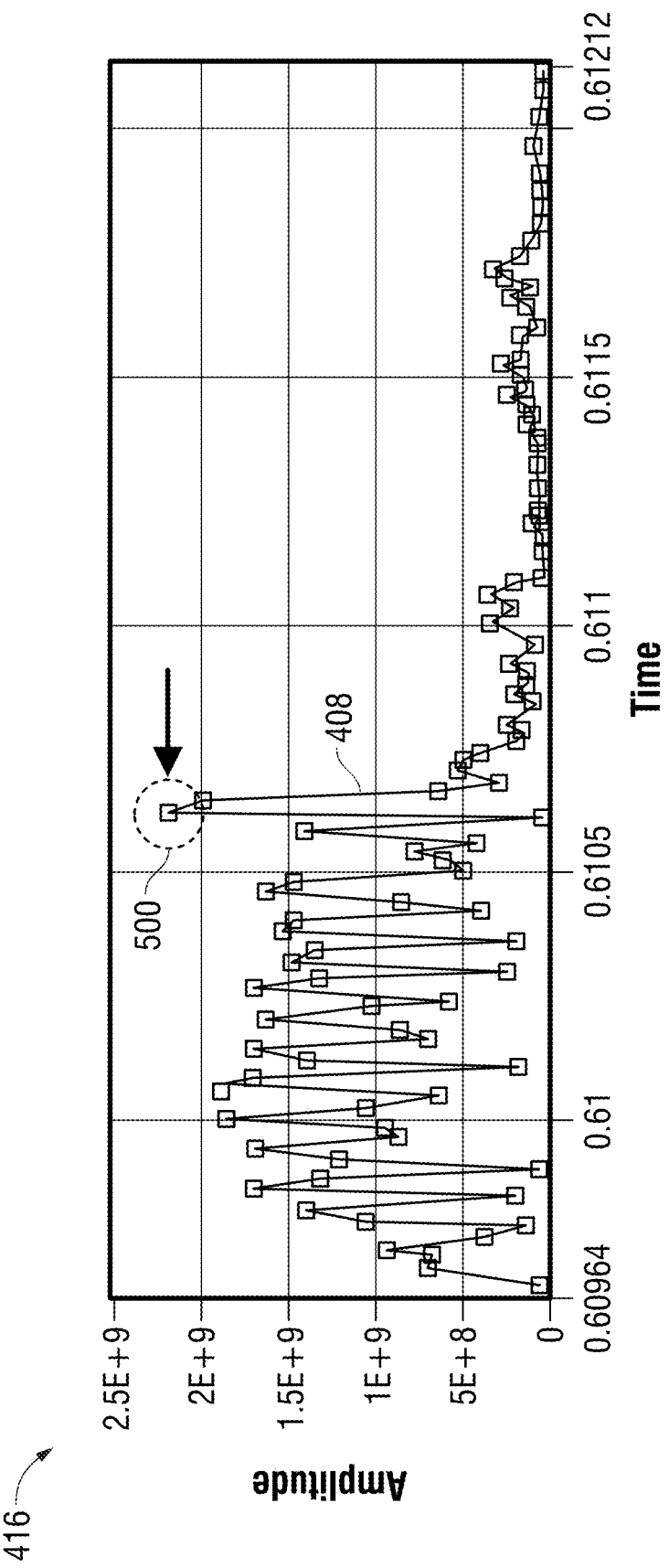
FIGS. 5A and 5B illustrate close-up views of waveform graphs demonstrating fault duration determination according to embodiments of the present disclosure.
Figure 5B:
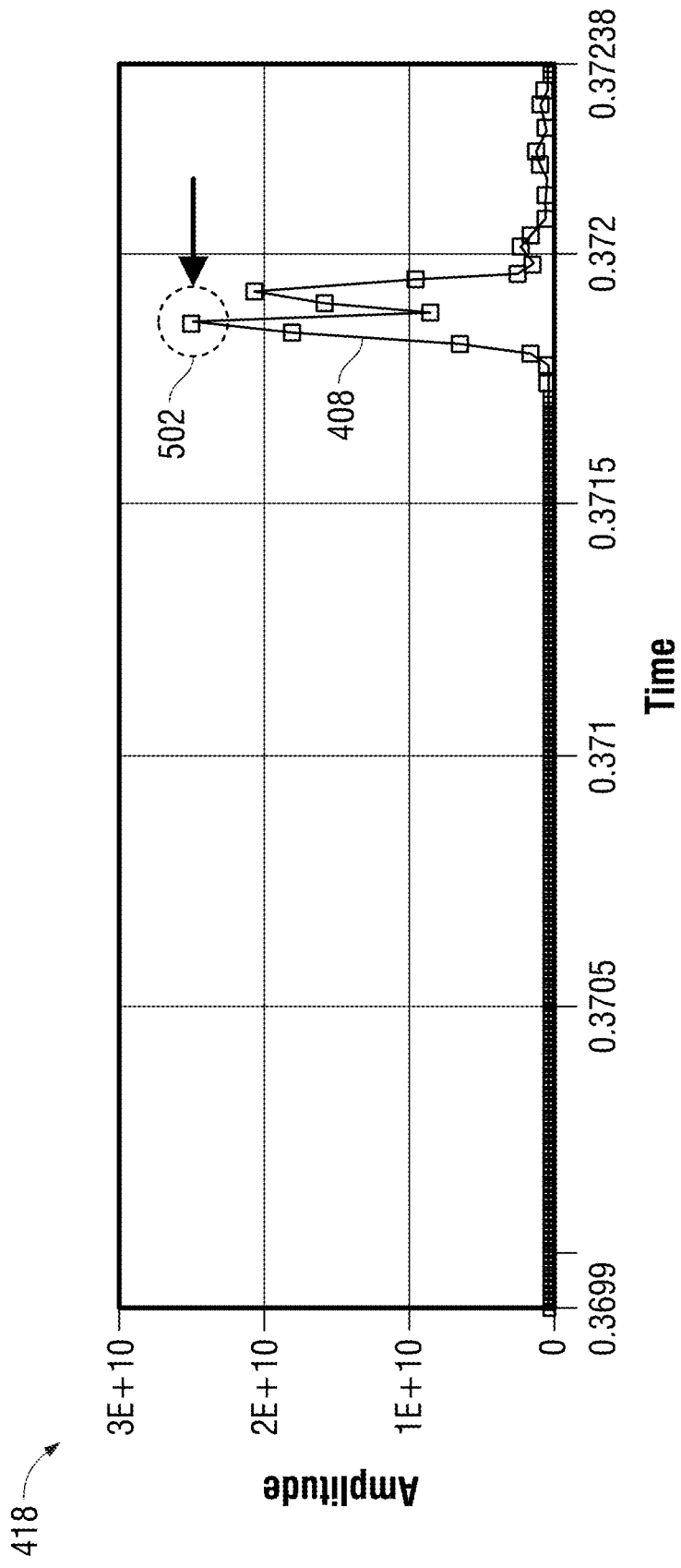

FIGS. 5A and 5B are close-up views showing a subset of the data 408 in the starting and ending time windows 416 and 418, respectively, in graph form. As before, the vertical axis in the graphs represents amplitude while the horizontal axis represents time. As can be seen in FIG. 5A, the second derivative of the subset of the data 408 in the starting time window 416 has produced a local maximum at peak 500. Similarly in FIG. 5B, the second derivative of the subset of the data 408 in the ending time window 418 has produced a local maximum at peak 502. These local maxima 500 and 502 are then set as the starting time ($t_{start}$) and the ending time ($t_{end}$) for the fault duration.

Figure 6:
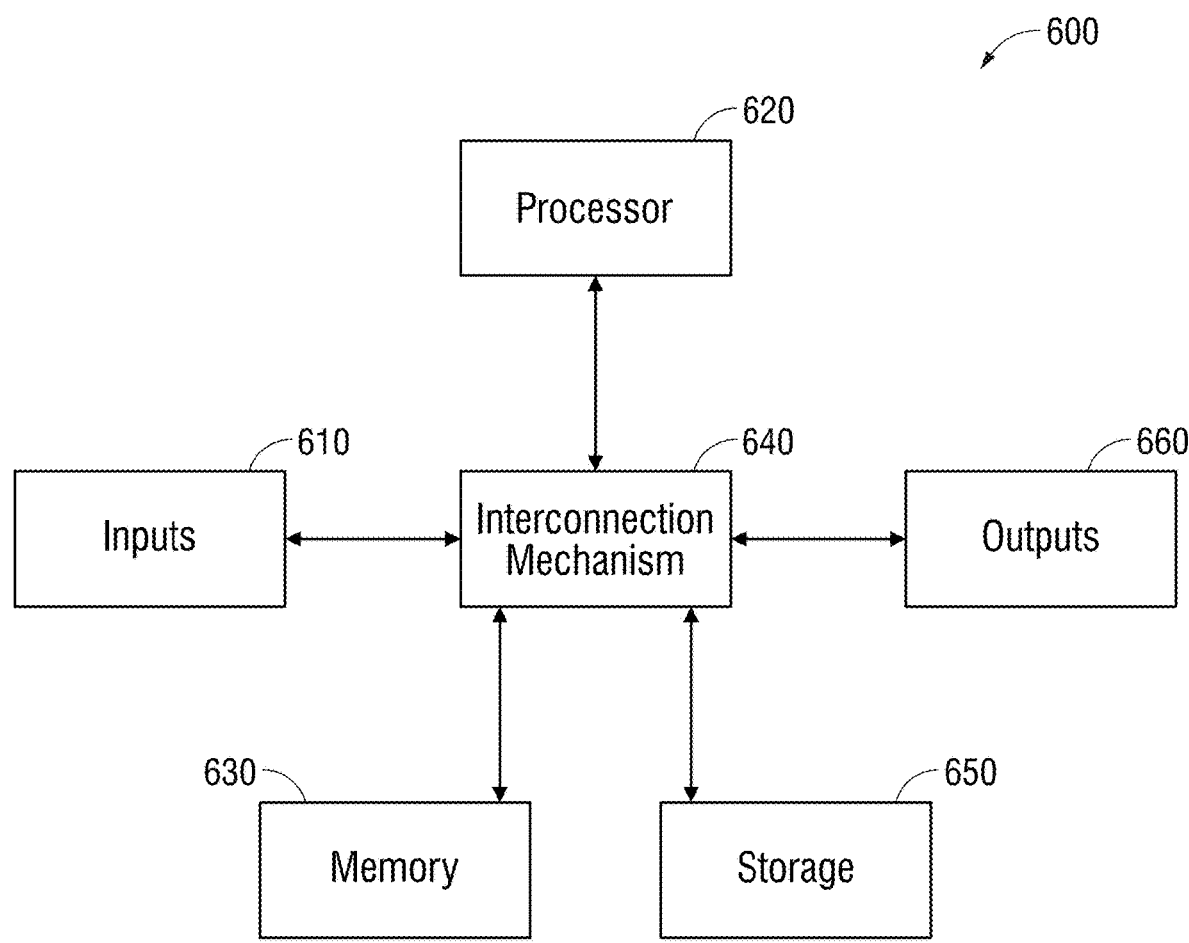
FIG. 6 illustrates an exemplary general-purpose CPU that may be used to implement various embodiments of this disclosure.

FIG. 6 illustrates an exemplary CPU 600 that may be used to implement various embodiments of this disclosure. In general, any general-purpose CPU may be used in various embodiments of this disclosure. For example, various embodiments of the disclosure may be implemented as specialized software executing in a CPU such as that shown at 600 in FIG. 6. The CPU 600 may include a processor 620 connected to one or more memory devices 630. Memory 630 is typically used for storing programs and data during operation of the CPU 600. The CPU 600 may also include a storage system 650 that provides additional storage capacity. Components of CPU 600 may be coupled by an interconnection mechanism 640, which may include one or more busses. The interconnection mechanism 640 enables communications (e.g., data, instructions) to be exchanged between components of CPU 600.

CPU 600 also includes one or more inputs 610 (e.g., for receiving data, instructions) and one or more outputs 660 (e.g., for providing data, instructions). In addition, CPU 600 may contain one or more interfaces (not shown) that connect CPU 600 to a communication network (in addition or as an alternative to the interconnection mechanism 640).

The CPU 600 may include specially programmed, special-purpose hardware, for example, an application-specific integrated circuit (ASIC). Aspects of the disclosure may be implemented in software, hardware or firmware, or any combination thereof. Further, such methods, acts, systems, system elements and components thereof may be implemented as part of the CPU described above or as an independent component.

Although CPU 600 is shown by way of example as one type of CPU upon which various aspects of the disclosure may be practiced, it should be appreciated that aspects of the disclosure are not limited to being implemented on the CPU as shown in FIG. 6. CPU 600 may be a general-purpose CPU that is programmable using a high-level programming language. CPU 600 may be also implemented using specially programmed, special purpose hardware. In CPU 600, processor 620 is typically a commercially available processor such as the STM32L412 MCU discussed above from STMicroelectronics, Inc.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. The non-transitory computer-readable medium are implemented in hardware and exclude carrier waves and propagating signals. The non-transitory computer-readable medium for purposes of this disclosure are not signals per se. Program code embodied on a computer-readable medium may be transmitted using any appropriate medium, including but not limited to wireless, wireline, optical fiber cable, RF, etc., or any suitable combination of the foregoing. Program code for carrying out operations for aspects of the present disclosure may be written in any combination of one or more programming languages.

While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by programming logic (e.g., program instructions, hardware logic, a combination of the two, etc.). Moreover, the execution of such program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A circuit interrupt protective device, comprising:
   a central processing unit (CPU);
   a sensor circuit connected to the CPU and configured to sense a current or a voltage waveform in the circuit interrupt protective device, the current or voltage waveform originating from an AC mains;
   an analog-to-digital converter (ADC) coupled to the CPU and configured to acquire the current or voltage waveform sensed by the sensor circuit;
   a fault detection module coupled to the ADC and configured to receive the current or voltage waveform acquired by the ADC, the fault detection module operable to detect a fault event based on the current or voltage waveform; and
   a fault duration module coupled to the ADC and configured to receive the current or voltage waveform acquired by the ADC, the fault duration module operable to obtain a duration of the fault event based on the current or voltage waveform;
   wherein the duration of the fault event is obtained by computing a second derivative for a portion of the current or voltage waveform, finding a local maximum or local minimum for the portion of the current or voltage waveform, and setting the local maximum or the local minimum as a starting time or an ending time for the duration of the fault event.

2. The circuit interrupt protective device according to claim 1, wherein the second derivative is computed locally by the fault duration module.

3. The circuit interrupt protective device according to claim 1, wherein the second derivative is computed on an external system using a digital twin of the circuit interrupt protective device.

4. The circuit interrupt protective device according to claim 1, wherein the portion of the current or voltage waveform is a window defined based on a transient amplitude of the current or voltage waveform that exceeds a predefined threshold.

5. The circuit interrupt protective device according to claim 4, wherein the window contains a predefined subset of data points representing the current or voltage waveform, the predefined subset of data points including the transient amplitude that exceeds the predefined threshold.

6. The circuit interrupt protective device according to claim 1, wherein an error is declared if the duration of the fault event exceeds a specified maximum.

7. The circuit interrupt protective device according to claim 6, wherein the CPU is operable to automatically take one or more actions in the circuit interrupt protective device if an error is declared.

8. A method of determining a duration of a fault event in a circuit interrupt protective device, the method comprising:
   sensing, at a sensor circuit of the circuit interrupt protective device, a current or a voltage waveform in the circuit interrupt protective device, the current or voltage waveform originating from an AC mains;
   acquiring, at an analog-to-digital converter (ADC) of the circuit interrupt protective device, the current or voltage waveform sensed by the sensor circuit;
   receiving, at a fault detection module of the circuit interrupt protective device, the current or voltage waveform acquired by the ADC, the fault detection module operable to detect a fault event based on the current or voltage waveform; and
   receiving, at a fault duration module of the circuit interrupt protective device, the current or voltage waveform acquired by the ADC, the fault duration module operable to obtain a duration of the fault event based on the current or voltage waveform;
   wherein the duration of the fault event is obtained by computing a second derivative for a portion of the current or voltage waveform, finding a local maximum or a local minimum for the portion of the current or voltage waveform, and setting the local maximum or the local minimum as a starting time or an ending time for the duration of the fault event.

9. The method according to claim 8, wherein the second derivative is computed locally by the circuit interrupt protective device.

10. The method according to claim 8, wherein the second derivative is computed on an external system using a digital twin of the circuit interrupt protective device.

11. The method according to claim 8, further comprising defining the portion of the current or voltage waveform as a window based on a transient amplitude of the current or voltage waveform that exceeds a predefined threshold.

12. The method according to claim 11, wherein the window contains a predefined subset of data points representing the current or voltage waveform, the predefined subset of data points including the transient amplitude that exceeds the predefined threshold.

13. The method according to claim 8, further comprising declaring an error in the circuit interrupt protective device if the duration of the fault event exceeds a specified maximum.

14. The method according to claim 13, further comprising automatically taking one or more actions in the circuit interrupt protective device if an error is declared.

15. A non-transitory computer-readable medium having computer-readable instructions stored thereon for determining a duration of a fault event in a circuit interrupt protective device, the computer-readable instructions, when executed by a processor, cause the processor to perform a process that:
- senses, at a sensor circuit of the circuit interrupt protective device, a current or a voltage waveform in the circuit interrupt protective device, the current or voltage waveform originating from an AC mains;
- acquires, at an analog-to-digital converter (ADC) of the circuit interrupt protective device, the current or voltage waveform sensed by the sensor circuit;
- receives, at a fault detection module of the circuit interrupt protective device, the current or voltage waveform acquired by the ADC, the fault detection module operable to detect a fault event based on the current or voltage waveform; and
- receives, at a fault duration module of the circuit interrupt protective device, the current or voltage waveform acquired by the ADC, the fault duration module operable to obtain a duration of the fault event based on the current or voltage waveform;
- wherein the duration of the fault event is obtained by computing a second derivative for a portion of the current or voltage waveform, finding a local maximum or a local minimum for the portion of the current or voltage waveform, and setting the local maximum or the local minimum as a starting time or an ending time for the duration of the fault event.

16. The non-transitory computer-readable medium according to claim 15, wherein the computer-readable instructions cause the second derivative to be computed locally on the circuit interrupt protective device.

17. The non-transitory computer-readable medium according to claim 15, wherein the computer-readable instructions cause the second derivative to be computed on an external system using a digital twin of the circuit interrupt protective device.

18. The non-transitory computer-readable medium according to claim 15, wherein the computer-readable instructions define the portion of the current or voltage waveform as a window based on a transient amplitude of the current or voltage waveform that exceeds a predefined threshold.

19. The non-transitory computer-readable medium according to claim 18, wherein the window contains a predefined subset of data points representing the current or voltage waveform, the predefined subset of data points including the transient amplitude that exceeds the predefined threshold.

20. The non-transitory computer-readable medium according to claim 15, wherein the computer-readable instructions cause an error to be declared if the duration of the fault event exceeds a specified maximum, and further cause one or more actions to be taken automatically in the circuit interrupt protective device if an error is declared.

* * * * *